United States Patent
Seo et al.

(10) Patent No.: US 7,684,941 B2
(45) Date of Patent: Mar. 23, 2010

(54) BATTERY MANAGEMENT SYSTEM AND DRIVING METHOD THEREOF

(75) Inventors: Se-Wook Seo, Yongin-si (KR); Soo-Seok Choi, Yongin-si (KR); Young-Jo Lee, Yongin-si (KR); Yong-Jun Tae, Yongin-si (KR); Han-Seok Yun, Yongin-si (KR); Gye-Jong Lim, Yongin-si (KR); Beom-Gyu Kim, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 234 days.

(21) Appl. No.: 11/850,701

(22) Filed: Sep. 6, 2007

(65) Prior Publication Data

US 2008/0065336 A1   Mar. 13, 2008

(30) Foreign Application Priority Data

Sep. 8, 2006   (KR) ...................... 10-2006-0086916

(51) Int. Cl.
*G01R 31/36* (2006.01)
(52) U.S. Cl. ........................................ 702/63
(58) Field of Classification Search ............ 702/63, 702/64, 182–185, 188
See application file for complete search history.

(56) References Cited

U.S. PATENT DOCUMENTS

| 7,098,625 B2 | 8/2006 | Yumoto et al. |
| 2003/0076109 A1 | 4/2003 | Verbrugge et al. |
| 2005/0084745 A1* | 4/2005 | Colello et al. .................. 429/61 |

FOREIGN PATENT DOCUMENTS

| CN | 1503399 | 6/2004 |
| JP | 2003-134678 | 5/2003 |
| JP | 2004-178848 | 6/2004 |
| JP | 2004-354050 | 12/2004 |
| KR | 2005-83854 | 8/2005 |
| WO | WO 2004/038822 | 5/2004 |

* cited by examiner

*Primary Examiner*—Edward Raymond
(74) *Attorney, Agent, or Firm*—Stein McEwen, LLP

(57) ABSTRACT

A battery management system to estimate a state of charge of a battery and a driving method thereof includes a sensing unit and a micro control unit. The sensing unit measures a battery voltage. The MCU measures a first time and a second time, detects first and second battery voltages that respectively correspond to the first and second times from the battery voltage, estimates an open circuit voltage by the first and second voltages, and establishes the SOC that corresponds to the OCV.

12 Claims, 4 Drawing Sheets

BATTERY MANAGEMENT SYSTEM AND DRIVING METHOD THEREOF

CROSS-REFERENCE TO RELATED APPLICATION

This application claims the benefit of Korean Application No. 2006-86916, filed Sep. 8, 2006 in the Korean Intellectual Property Office, the disclosure of which is incorporated herein by reference.

BACKGROUND OF THE INVENTION

1. Field of the Invention

Aspects of the present invention relate to a battery management system. More particularly, aspects of the present invention relate to a battery management system used in a vehicle using electrical energy.

2. Description of the Related Art

Vehicles having an internal combustion engine run with gasoline or heavy oil have caused serious air pollution. Accordingly, various efforts to develop electric or hybrid vehicles have recently been made to reduce air pollution.

An electric vehicle uses an electric motor powered by electrical energy output by a battery. Since the electric vehicle mainly uses a battery formed by one battery pack including a plurality of rechargeable/dischargeable secondary cells, advantages thereof includes no emission gases and less noise.

A hybrid vehicle commonly refers to a gasoline-electric hybrid vehicle which uses gasoline to power an internal-combustion engine and a battery to power an electric motor. Recently, hybrid vehicles that use an internal-combustion engine and fuel cells, and hybrid vehicles that use a battery and fuel cells have been developed. The fuel cells directly obtain electrical energy by generating a chemical reaction while hydrogen and oxygen are continuously provided.

Since battery performance directly affects a vehicle that uses electrical energy of the battery, each battery cell of the battery should perform well. Also, a battery management system (BMS) should measure a voltage and a current of the overall battery to efficiently manage charging/discharging operations of each battery cell.

In general, the battery management system uses a data table containing a relationship data of an open circuit voltage (OCV) to a state of charge (SOC) to estimate the SOC. When using the data table, the OCV should be precisely measured so as to precisely calculate the SOC.

When a vehicle is driven at a fixed speed or is stopped, and a charging and discharging operation of the battery is not performed, the OCV may not be precisely measured due to polarization of internal resistance of the battery. A time to dissipate the polarization should be sufficient to precisely measure the OCV. However, it is difficult to be guaranteed of such a time when a hybrid vehicle is driven. Accordingly, an error in the OCV measured during an insufficiently short time may cause an error in the calculating of the SOC.

In addition, since an error in controlling the battery to be charged and discharged is generated when an error in calculating the SOC occurs, the battery may be overcharged or over-discharged, which seriously affects battery performance.

SUMMARY OF THE INVENTION

Aspects of the present invention has been made in an effort to provide a battery management system to more precisely estimate an open circuit voltage (OCV) and to establish a state of charge (SOC), and a driving method thereof.

According to aspects of the present invention, a battery management system used to establish a state of charge (SOC) of a battery used in the battery management system includes a sensing unit and a micro control unit (MCU). The sensing unit measures a battery voltage, while the MCU measures a first time and a second time, detects first and second battery voltages that respectively correspond to the first and second times from the battery voltage, estimates an open circuit voltage (OCV) by the first and second voltages, and determines the SOC that corresponds to the OCV. The first time is a time when an effect of an internal resistance of the battery is eliminated, and the second time is a time after a predetermined period has passed from the first time to dissipate polarization caused by electrolyte diffusion. The MCU includes an OCV estimator and an SOC establishment unit. The OCV estimator estimates the OCV by using the first and second voltages, while the SOC establishment unit receives the OCV and establishes the SOC that corresponds to the OCV. The OCV estimator generates a linear equation given as $$Y = \frac{T2-T1}{\frac{1}{\sqrt{T2}} - \frac{1}{\sqrt{T1}}} * X + A$$

(where, X denotes a parameter in $$\frac{1}{\sqrt{T}},$$

and Y denotes a parameter in voltage) from a graph that passes through coordinates $$\frac{1}{(\sqrt{T1}, V1)}$$

that correspond to the first time and coordinates $$\frac{1}{(\sqrt{T2}, V2)}$$

that corresponds to the second time, and estimates a value of a Y-axis coordinate when an X-axis coordinate value is 0 as the OCV by using the linear equation.

In an aspect of the driving method of a battery management system to establish a state of charge (SOC) of a battery used in the battery management system, the method includes: when the battery is not charged and discharged, a first time and a second time are measured, and a first battery voltage that corresponds to the first time and a second battery voltage that corresponds to the second time are detected; generating a linear equation having the first time, the first battery voltage, the second time, and the second battery voltage is generated; and an open circuit voltage (OCV) is estimated by using the linear equation. In generating the linear equation, the linear equation given as $$Y = \frac{T2 - T1}{\frac{1}{\sqrt{T2}} - \frac{1}{\sqrt{T1}}} * X + A$$

(where, X denotes a parameter in $$\frac{1}{\sqrt{T1}},$$

and Y denotes a parameter in voltage) is generated from a graph or slope that passes through coordinates $$\left(\frac{1}{\sqrt{T1}}, V1\right)$$

that correspond to the first time and coordinates $$\left(\frac{1}{\sqrt{T2}}, V2\right)$$

that correspond to the second time, and a value of a Y-axis coordinate when an X-axis coordinate value is 0 is estimated as the OCV. In addition, the estimated OCV is received, a table for the SOC that corresponds to the OCV is used, and the SOC is established.

According to aspects of the present invention, a driving method of a battery management system to obtain a state of charge (SOC) of a rechargeable battery includes: measuring at least two times; detecting at least two voltages of the rechargeable battery that correspond to respective ones of the at least two times; determining an open circuit voltage (OCV) of the rechargeable battery based on the at least two times and the at least two voltages; and determining the SOC of the rechargeable battery that corresponds to the determined OCV.

According to aspects of the present invention, a method to obtain a state of charge (SOC) of a rechargeable battery includes: detecting voltage of the rechargeable battery corresponding to time; determining an open circuit voltage (OCV) of the rechargeable battery using an inverse relationship of the time relative to the voltage; and determining the SOC of the rechargeable battery that corresponds to the determined OCV.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which.

DETAILED DESCRIPTION OF THE EMBODIMENTS

Figure 1:
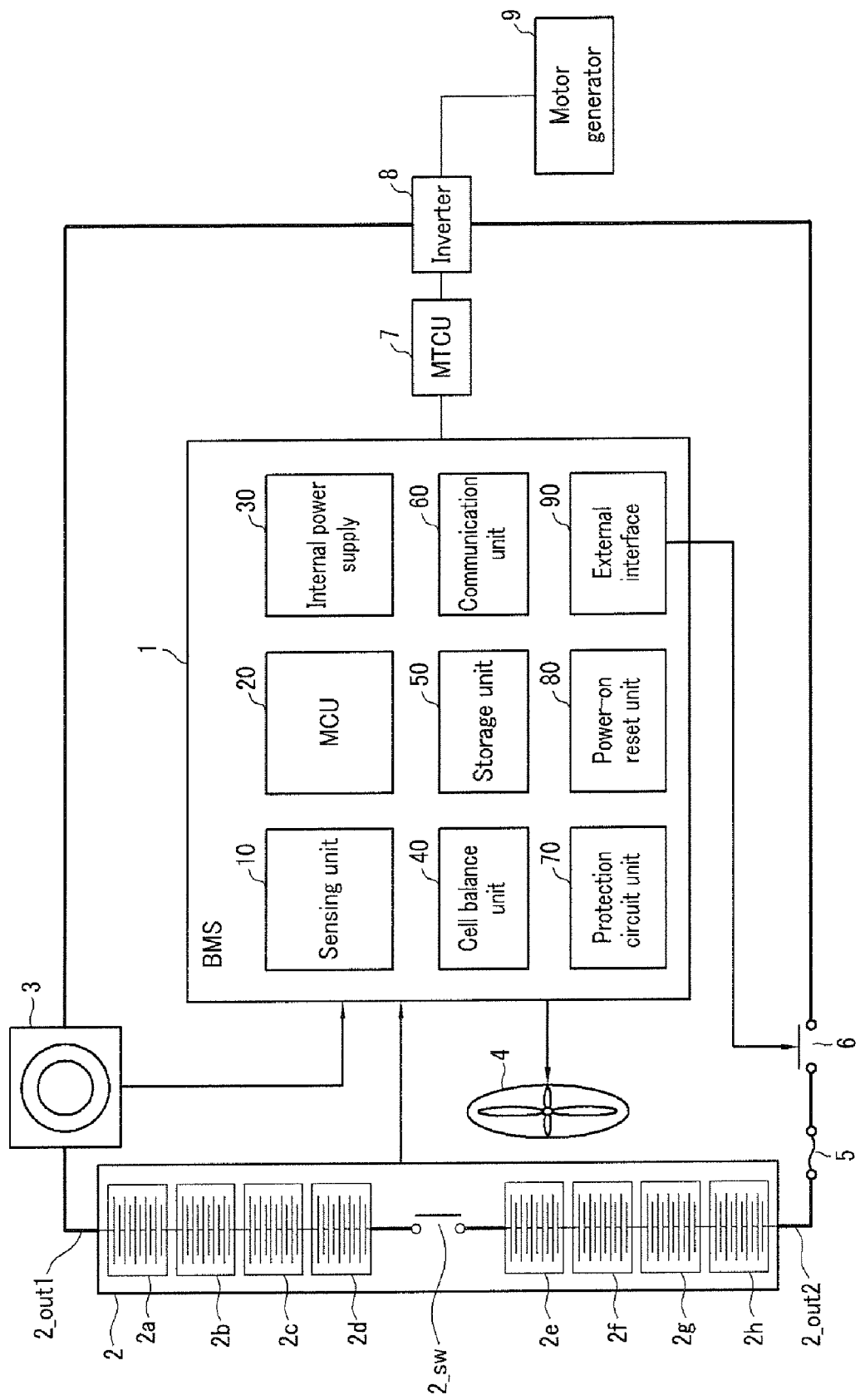
FIG. 1 shows a diagram of a configuration of a hybrid vehicle system according to an aspect of the present invention.

Reference will now be made in detail to aspects of the present invention, examples of which are illustrated in the accompanying drawings, wherein like reference numerals refer to the like elements throughout. The aspects are described below in order to explain the present invention by referring to the figures.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise", and variations such as "comprises" or "comprising", will be understood to imply the inclusion of stated elements but not the exclusion of any other elements.

FIG. 1 shows a diagram of a configuration of a hybrid vehicle system according to an aspect of the present invention. As shown in FIG. 1, the hybrid electric vehicle system includes a battery management system 1, a battery 2, a current sensor 3, a cooling fan 4, a fuse 5, a main switch 6, a motor control unit (MTCU) 7, an inverter 8, and a motor generator 9.

The battery 2 includes a plurality of sub-packs 2a to 2h having a plurality of battery cells coupled in series to each other, an output terminal 2_OUT1, an output terminal 2_OUT2, and a safety switch 2_SW provided between the sub-pack 2d and the sub-pack 2e. While eight sub-packs 2a to 2h are shown as an example and each sub-pack is a group of a plurality of battery cells, aspects of the present invention are not limited thereto. In addition, the safety switch 2_SW is selectively turned on/off to guarantee the safety of a worker when performing operations on the battery or replacing the battery. In a non-limiting aspect of the present invention, the safety switch 2_SW is provided between the sub-pack 2d and the sub-pack 2e. The output terminal 2_OUT1 and the output terminal 2_OUT2 are coupled, for example, to the inverter 8.

The current sensor 3 measures an output current value of the battery 2 and outputs the measured output current value to a sensing unit 10 of the BMS 1. In further detail, the current sensor 3 may be a hall current transformer using a hall element to measure a current value and to output an analog current signal that corresponds to the measured current value. However, it is understood that other types of current sensors are within the scope of the invention.

The cooling fan 4 cools down heat generated by charging and discharging of the battery 2 in response to a control signal of the BMS 1, prevents the battery 2 from being deteriorated by a temperature increase, and prevents the charging and discharging efficiencies of the battery 2 from being deteriorated.

The fuse 5 prevents an overflowing current, which may be caused by a disconnection or a short circuit of the battery 2, from being transmitted to the battery 2. That is, when an overcurrent is generated, the fuse 5 is disconnected to interrupt the current from overflowing and to isolate the battery 2 from the overcurrent.

The main switch 6 turns on/off the battery in response to the control signal of the BMS 1 or a control signal of the MTCU 7 when an unusual phenomenon, such as an overflow voltage, the overcurrent, and/or overheating (a high temperature), occurs.

In various aspects, the BMS 1 includes a sensing unit 10, a micro control unit (MCU) 20, an internal power supply 30, a cell balance unit 40, a storage unit 50, a communication unit 60, a protection circuit unit 70, a power-on reset unit 80, and an external interface 90. The sensing unit 10 measures a voltage of the battery and transmits the sensed voltage to the MCU 20. Hereinafter, a voltage at an output terminal of the battery will be referred to as a battery voltage.

The MCU 20 detects a state of charge (SOC) of the battery 2 based on the battery voltage transmitted from the sensing unit 10, and generates information that informs of a state of the battery 2. Then, the MCU 20 transmits the generated information to the MTCU 7 of the vehicle. In addition, when the vehicle is stopped or driven at a fixed speed and the battery is not charged and discharged, the MCU 20 detects a first voltage V1 of a first time T1 and a second voltage V2 of a second time T2 to generate an equation, such as a linear equation (or a line equation). The MCU 20 uses the linear equation to estimate an open circuit voltage (OCV), and establishes (or estimates) the SOC that corresponds to the estimated OCV.

The internal power supply 30 supplies power to the BMS 1 by using a backup battery. The cell balance unit 40 balances the state of charge of each cell. That is, cells sufficiently charged are discharged, and cells relatively less charged are further charged. The storage unit 50 stores data of the current SOC and a current state of health (SOH) of the battery when the power source of the BMS 1 is turned off.

The communication unit 60 communicates with the MTCU 7 of the vehicle. The protection circuit unit 70 uses a firmware to protect the battery 2 from shocks, overflow currents, low voltages, and/or the like. The power-on reset unit 80 resets the overall system when the power source of the BMS 1 is turned on. The external interface 90 couples BMS auxiliary devices, such as the cooling fan 4 and the main switch 6, to the MCU 20. While the cooling fan 4 and the main switch 6 are shown as the BMS auxiliary devices as examples, aspects of the present invention are not limited thereto.

The MTCU 7 determines a torque state (or information) of the vehicle based on information of an accelerator, a brake, and a vehicle speed, and controls an output of the motor generator 9 so that the output corresponds to the torque state (or information). That is, the MTCU 7 controls a switching operation of the inverter 8, and controls the output of the motor generator 9 so that the output corresponds to the torque state and/or its information. In addition, the MTCU 7 receives the SOC of the battery 2 from the MCU 20 through the communication unit 60, and controls the SOC level of the battery 2 to be a target level (e.g., 55%). For example, when the SOC level transmitted from the MCU 20 is lower than 55%, the MTCU 7 controls a switch of the inverter 8 to output power toward the battery 2 and charge the battery 2. In this case, the battery pack is a negative value (−). When the SOC level is greater than 55%, the MTCU 7 controls the switch of the inverter 8 to output the power toward the motor generator 9 and discharge the battery 2. In this case, the battery pack current (I) is a positive value (+). It is understood that the target level of the SOC to charge and/or discharge the battery may be any value.

The inverter 8 controls the battery 2 to be charged and/or discharged in response to the control signal of the MTCU 7. The motor generator 9 uses the electrical energy of the battery to drive the vehicle based on the torque information transmitted from the MTCU 7.

Hereinafter, a method to establish the SOC of the battery, the battery management system, and a driving method thereof will be described with reference to FIG. 2 to FIG. 4.

Figure 2:
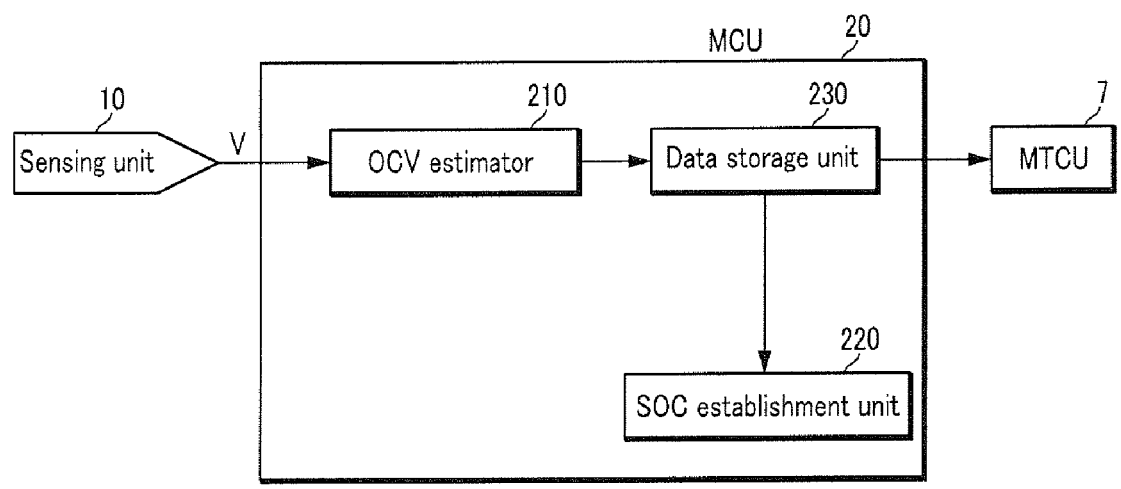
FIG. 2 shows a schematic diagram of the MCU 20 of the battery management system shown in FIG. 1.
Figure 3A:
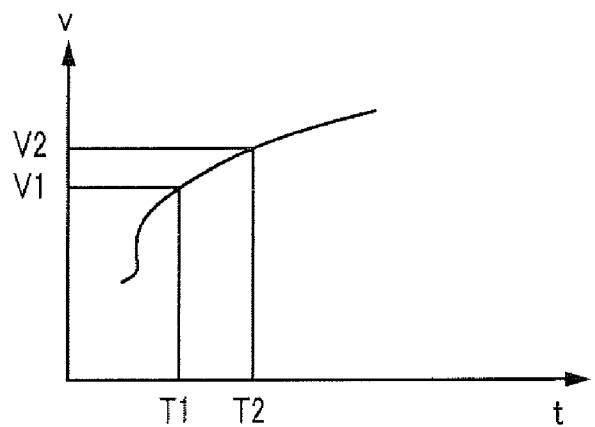
FIGS. 3A and 3B show diagrams representing a relationship between time and battery voltages according to aspects of the present invention.
Figure 3B:
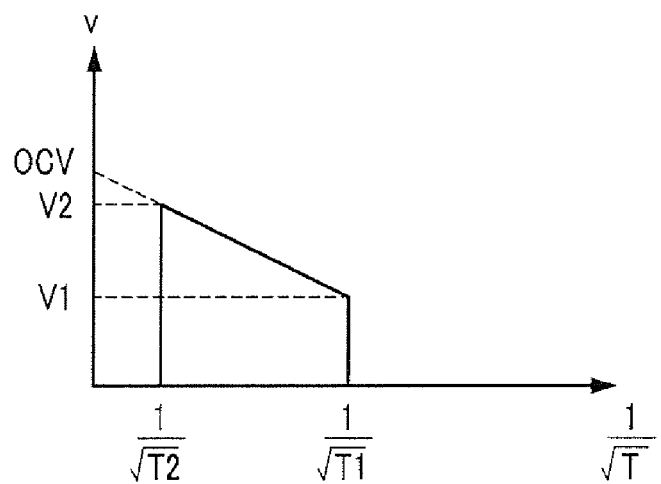

FIG. 2 shows a schematic diagram of the MCU 20 of the battery management system as shown in FIG. 1, and FIGS. 3A and 3B show diagrams representing a relationship between times and battery voltages. As shown in FIG. 2, the MCU 20 includes an OCV estimator 210, a data storage unit 230, and an SOC establishment unit 220.

When the vehicle is stopped or driven at a fixed speed, and the battery is not charged and/or discharged, the OCV estimator 210 detects a battery voltage at the first time T1 and a battery voltage at the second time T2 using the battery voltage input from the sensing unit 10. The first time T1 corresponds to a time when the effect caused by internal resistance of the battery 2 is eliminated. The second time T2 corresponds to a time when a predetermined time passes from the time of solving (or dissipating) the polarization caused by electrolyte diffusion, after the effect of the resistance caused by the internal resistance is eliminated. In a non-limiting aspect, the above times may be experimentally established. In another aspect, the times T1 and/or the T2 may simply be set and/or predetermined. The OCV estimator 210 uses the detected first battery voltage V1 and second battery voltage V2 to estimate the OCV, as discussed below.

FIGS. 3A and 3B show diagrams representing a relationship between time and battery voltages according to aspects of the present invention.

As shown in FIG. 3A, when the battery is not charged and/or discharged, the OCV estimator 210 detects the first battery voltage V1 at the first time T1, and the second battery voltage V2 at the second time T2 after the predetermined time passes from the first time T1. The OCV estimator 210 takes the detected voltage-time information as represented by FIG. 3A and determines or obtains the voltage-time information as represented by a linear graph shown in FIG. 3B. As represented in FIG. 3A, the polarization is solved (or dissipated) and the battery voltage is stabilized as the time t passes. When the time t is ideally unlimited (or approaches infinity), the polarization is completely solved (or dissipated), and the OCV may be precisely detected.

According to aspects of the present invention, the MCU 20 generates the linear equation (or the line equation) as discussed above. The OCV estimator 210 uses the linear equation and may estimate the OCV at an unlimited time (at infinity, for example). In this case, to detect (or estimate) the OCV at the time the battery is most stable, the OCV estimator 210 changes the graph shown in FIG. 3A to the graph shown in FIG. 3B. Accordingly, a line that passes through coordinates $$\left( \frac{1}{\sqrt{T1}}, V1 \right)$$

that correspond to the first time T1 and coordinates $$\left( \frac{1}{\sqrt{T2}}, V2 \right)$$

that correspond to the second time T2, are used so as to generate the linear equation. In FIG. 3B, X-axis coordinates have a parameter of $$\frac{1}{\sqrt{T}},$$

and Y-axis coordinates have a parameter of the battery voltage (v). That is, in various aspects of the present invention, the battery voltage is inversely proportional to the time. That is, the voltage is inversely proportional to the square root of the time.

The OCV estimator 210 uses Equation 1 and coordinates that correspond to the first and second times T1 and T2 to detect a value of a slope (a) in the linear graph shown in FIG. 3B, as shown below.

$$a = \frac{T2 - T1}{\frac{1}{\sqrt{T2}} - \frac{1}{\sqrt{T1}}} \quad \text{[Equation 1]}$$

In addition, the OCV estimator 210 generates a linear equation (or a line equation) given as Equation 2 in the graph having the slope (a), and as shown in FIG. 3B, and as discussed below.

$$Y = \frac{V2 - V1}{\frac{1}{\sqrt{T2}} - \frac{1}{\sqrt{T1}}} * X + A \quad \text{[Equation 2]}$$

Here, X denotes a parameter in $$\frac{1}{\sqrt{T}}$$

which is obtained by converting from the time t, and Y denotes a parameter in voltage (v).

In the OCV estimator 210, when the time t goes to infinity as shown in FIG. 3B, a voltage value that corresponds to the Y-axis coordinate value becomes the open circuit voltage (OCV). In this case, a value of the Y-axis coordinate is estimated (or extrapolated) as the OCV when an X-axis coordinate value is 0 (because $$\frac{1}{\sqrt{T}}$$

becomes 0 when time (T) becomes infinite) and the battery voltage is stabilized. The data storage unit 220 stores the battery state information. That is, the data storage unit 220 includes a data table of the SOC that corresponds to the OCV. The SOC establishment unit 230 receives the OCV from the OCV estimator 210, uses the data table of the SOC that corresponds to the OCV, and establishes the SOC that corresponds to the OCV.

Figure 4:
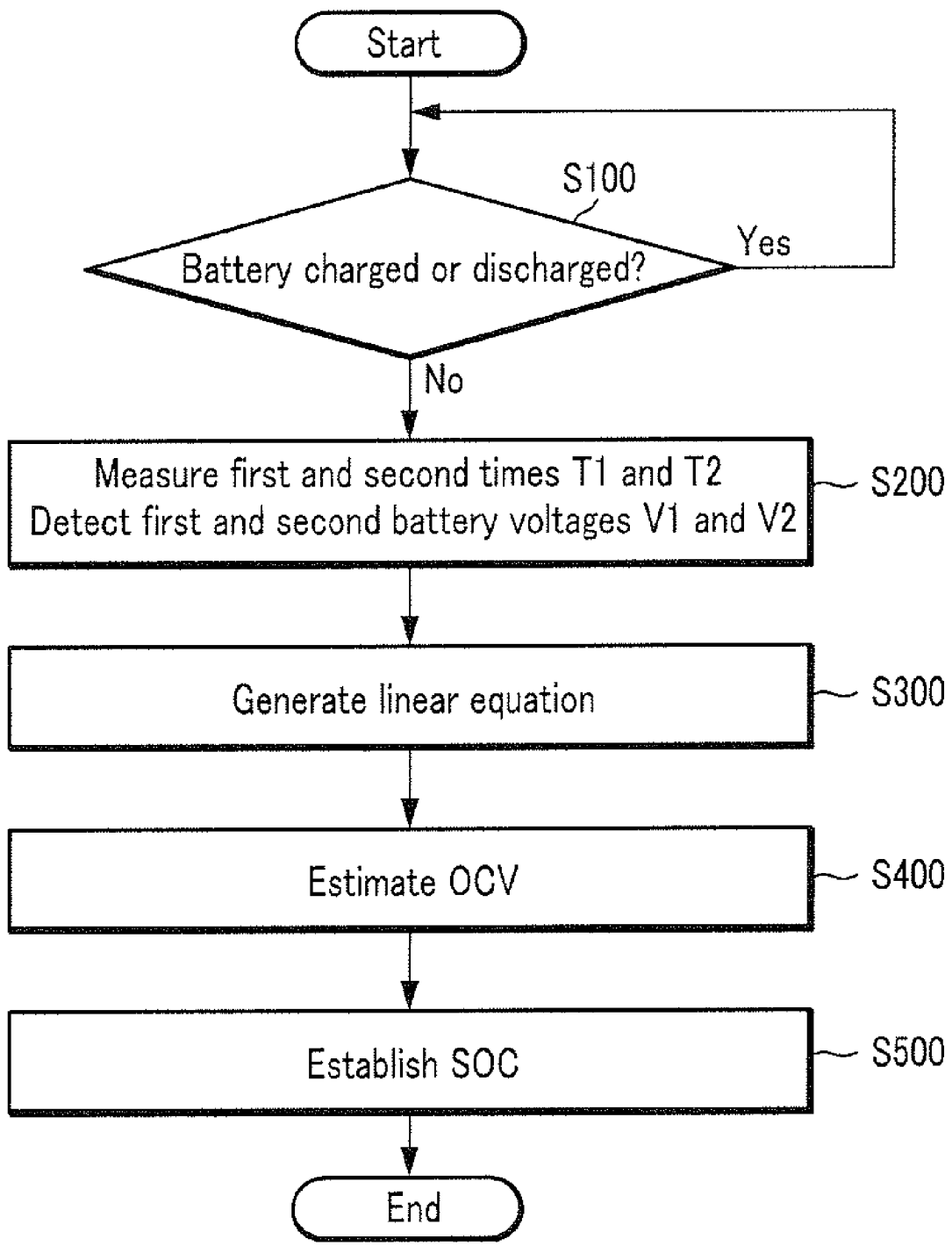
FIG. 4 shows a flowchart representing a driving method of the battery management system according to aspects of the present invention.

FIG. 4 shows a flowchart representing a driving method of the battery management system according an aspect of the present invention.

Initially, the MCU 20 of the BMS 1 determines whether the battery is charged and/or discharged in operation S100. When it is determined in operation S100 that the battery is charged and/or discharged, the operation S100 is performed again. When it is determined in operation S100 that the battery is not charged and/or discharged, the first time T1 and the first battery voltage V1 that corresponds to the first time T1 are detected, and the second time T2 and the second battery voltage V2 that corresponds to the second time T2 are detected in operation S200.

A graph (or line) that passes through coordinates $$\left(\frac{1}{\sqrt{T1}}, V1\right)$$

that correspond to the first time T1 and coordinates $$\left(\frac{1}{\sqrt{T2}}, V2\right)$$

that correspond to the second time T2 is formed, and a linear equation is generated as Equation 2 having the respective coordinates, in operation S300.

From the linear equation generated in operation S300, a value A (the Y-intercept) of the Y-axis coordinate when an X-axis coordinate value is 0 is estimated (or determined) as an OCV in operation S400. The OCV estimated in operation S400 is received, and an SOC that corresponds to the OCV is established in operation S500 by using a data table of the SOC that corresponds to the OCV.

As described, shown is the battery management system of the method of establishing the SOC by estimating the OCV, and the driving method thereof. According to aspects of the present invention, the first time T1 and the corresponding first battery voltage V1 are detected, the second time T2 and the corresponding second battery voltage V2 are detected, and a corresponding linear equation is generated. The OCV is then estimated using the generated linear equation. The SOC is established by using a data table of the SOC that corresponds to the OCV.

According to aspects of the present invention, the OCV may be estimated quickly and within a short time. Accordingly, the battery management system to precisely estimate the SOC and the driving method thereof may be provided.

In addition, since an SOC estimation error caused by an error in measuring the OCV is prevented, the battery management system for preventing the battery from being overcharged and over-discharged and the driving method thereof may be provided.

While not required in all aspects, elements of the method can be implemented as software and/or firmware for use with one or more processors and/or computers. Moreover a processor and/or computer readable medium maybe encoded with computer and/or processor-executable instructions for performing the method.

Additionally, although implemented as a battery management system of a vehicle, aspects of the present invention may be implemented with any rechargeable battery system.

Additionally, although implemented as detecting a first and a second time data, aspects of the present invention may detect at least one voltage of the rechargeable battery that corresponds to the at least one time, to determine an open circuit voltage (OCV) of the rechargeable battery based on the at least one time and the at least one voltage, and to determine the SOC of the rechargeable battery that corresponds to the determined OCV.

Although a few aspects of the present invention have been shown and described, it would be appreciated by those skilled in the art that changes may be made in the aspects without departing from the principles and spirit of the invention, the scope of which is defined in the claims and their equivalents.

What is claimed is:

1. A battery management system used to establish a state of charge (SOC) of a battery used in the battery management system, the battery management system comprising:
   a sensing unit to measure a battery voltage; and
   a micro control unit (MCU) to measure a first time and a second time, to detect first and second battery voltages that respectively correspond to the first and second times from the battery voltage, to estimate an open circuit voltage (OCV) by the first and second voltages, and to determine the SOC that corresponds to the OCV.

2. The battery management system of claim 1, wherein the first time is measured when an effect of an internal resistance of the battery is eliminated, and the second time is measured after a predetermined period has passed from the first time to dissipate polarization caused by electrolyte diffusion.

3. The battery management system of claim 1, wherein the MCU comprises:
   an OCV estimator to estimate the OCV by using the first and second voltages; and
   an SOC establishment unit to receive the OCV and to determine the SOC that corresponds to the OCV.

4. The battery management system of claim 1, further comprising an OCV estimator, wherein the OCV estimator generates a linear equation given as $$Y = \frac{V2 - V1}{\frac{1}{\sqrt{T2}} - \frac{1}{\sqrt{T1}}} * X + A$$

from a slope that passes through coordinates $$\frac{1}{\left(\sqrt{T1}, V1\right)}$$

that correspond to the first time and coordinates $$\frac{1}{\left(\sqrt{T2}, V2\right)}$$

that correspond to the second time, and estimates a value of a Y-axis coordinate as the OCV when an X-axis coordinate value is 0 by using the linear equation, where, X denotes a parameter in $$\frac{1}{\sqrt{T}},$$

and Y denotes a parameter in voltage.

5. A driving method of a battery management system to establish a state of charge (SOC) of a battery used in the battery management system, the driving method comprising:

when the battery is not charged and/or discharged, measuring a first time and a second time, and detecting a first battery voltage that corresponds to the first time and a second battery voltage that corresponds to the second time;
generating a linear equation that includes the first time, the first battery voltage, the second time, and the second battery voltage; and
estimating an open circuit voltage (OCV) of the battery by using the linear equation.

6. The driving method of claim 5, wherein, the generating of the linear equation includes generating the linear equation given as $$Y = \frac{V2 - V1}{\frac{1}{\sqrt{T2}} - \frac{1}{\sqrt{T1}}} * X + A$$

is generated from a slope that passes through coordinates $$\frac{1}{\left(\sqrt{T1}, V1\right)}$$

that correspond to the first time and coordinates $$\frac{1}{\left(\sqrt{T2}, V2\right)}$$

that correspond to the second time, and a value of a Y-axis coordinate is estimated as the CCV when an X-axis coordinate value is 0, where X denotes a parameter in $$\frac{1}{\sqrt{T1}},$$

and Y denotes a parameter in voltage.

7. The driving method of claim 6, further comprising:
   receiving the estimated OCV;
   using a table to determine the SOC that corresponds to the CCV; and
   determining the SOC.

8. A computer readable medium recorded with a program for a computer to execute a method of driving a battery management system to establish a state of charge (SOC) of a battery used in the battery management system, wherein the computer executes the method of claim 5.

9. A driving method of a battery management system to obtain a state of charge (SOC) of a rechargeable battery, the driving method comprising:
   measuring at least two times;
   detecting at least two voltages of the rechargeable battery that correspond to respective ones of the at least two times;
   determining an open circuit voltage (OCV) of the rechargeable battery based on the at least two times and the at least two voltages; and
   determining the SOC of the rechargeable battery that corresponds to the determined OCV.

10. The driving method of the battery management system of claim 9, wherein the at least two times are measured based on when an effect of an internal resistance of the battery is eliminated, after a predetermined period has passed to dissipate polarization caused by electrolyte diffusion, or any combination thereof.

11. The driving method of the battery management system of claim 9, wherein the OCV is a Y-intercept of a line equation obtained based on the at least two times and the at least two voltages.

12. A method to obtain a state of charge (SOC) of a rechargeable battery, the method comprising:

detecting voltage of the rechargeable battery corresponding to time;

determining an open circuit voltage (OCV) of the rechargeable battery using an inverse relationship of the time relative to the voltage; and determining the SOC of the rechargeable battery that corresponds to the determined OCV.

* * * * *

UNITED STATES PATENT AND TRADEMARK OFFICE
CERTIFICATE OF CORRECTION

PATENT NO. : 7,684,941 B2  Page 1 of 1
APPLICATION NO. : 11/850701
DATED : March 23, 2010
INVENTOR(S) : Se-Wook Seo et al.

It is certified that error appears in the above-identified patent and that said Letters Patent is hereby corrected as shown below:

Column 10, line 35, change "CCV" to --OCV--;
Column 10, line 47, change "CCV" to --OCV--.

Signed and Sealed this

Twenty-seventh Day of July, 2010

David J. Kappos
*Director of the United States Patent and Trademark Office*